United States Patent [19]

Debesis

[11] 3,909,929

[45] Oct. 7, 1975

[54] METHOD OF MAKING CONTACTS TO SEMICONDUCTOR LIGHT CONVERSION ELEMENTS

[75] Inventor: John R. Debesis, Richmond Heights, Ohio

[73] Assignee: General Electric Company, Schenectady, N.Y.

[22] Filed: Dec. 26, 1973

[21] Appl. No.: 427,803

[52] U.S. Cl. ........................ 29/590; 29/591; 357/68

[51] Int. Cl.$^2$ ........................................... B01J 17/00

[58] Field of Search ........ 29/589, 590, 591; 357/68, 357/15; 252/514

[56] References Cited

UNITED STATES PATENTS

| | | | |
|---|---|---|---|
| 2,444,034 | 6/1948 | Collings | 252/514 |
| 3,386,867 | 6/1968 | Staples | 148/180 |
| 3,412,043 | 11/1968 | Gilliland | 252/514 |
| 3,448,349 | 6/1969 | Summer | 357/15 |

*Primary Examiner*—W. Tupman
*Attorney, Agent, or Firm*—Norman C. Fulmer; Lawrence R. Kempton; Frank L. Neuhauser

[57] ABSTRACT

A layer of metal such as gold-germanium eutectic is deposited on a surface of a semiconductor light conversion element such as a gallium phosphide light-emitting diode. The metal layer is heated to cause it to separate into distributed individual lumps of metal sintered onto the semiconductor surface. An electrical contact is made to some or all of the distributed lumps of metal.

10 Claims, 6 Drawing Figures

METHOD OF MAKING CONTACTS TO SEMICONDUCTOR LIGHT CONVERSION ELEMENTS

CROSS-REFERENCES TO RELATED APPLICATIONS

Ser. No. 427,936, John R. Debesis, "Reflective Coated Contact for Semiconductor Light Conversion Elements", filed concurrently herewith and assigned the same as this invention.

Ser. No. 427,935, John R. Debesis, "Reflective Contact for Semiconductor Light Conversion Elements", filed concurrently herewith and assigned the same as this invention.

Ser. No. 427,934, John R. Debesis, "Transparent Contact for Semiconductor LIght Conversion Elements", filed concurrently herewith and assigned the same as this invention.

BACKGROUND OF THE INVENTION

The invention is in the field of solid state light conversion devices employing light-emitting diodes or light-sensitive diodes and functioning in the infrared or visible light spectrum. In solid state lamps, the light-emitting diode is made from a flat "chip" of material, such as gallium arsenide, gallium phosphide, gallium arsenide phosphide, or silicon carbide, suitably doped with dopant material so as to form a p-n junction which emits light (visible or infrared) when current is passed therethrough. The p-n junction is between and parallel to the "top" and "bottom" surfaces of the diode, it being assumed for convenience that the light to be utilized is that which emerges through the top surface. Of the light emitted by the p-n junction, only a small amount exits through the top surface of the diode, due to the effect of the "critical angle" caused by the high index of refraction of the diode material, whereby only the light rays approaching the top surface perpendicularly and approximately perpendicularly can pass through the surface and become usefully emitted light, whereas the remaining majority of light rays are internally reflected at the top surface.

The amount of light emitted through the top surface of the diode can be increased by encapsulating the top surface of the diode with a material having a refractive index greater than unity, i.e., greater than that of air, thereby increasing the critical angle whereby a greater amount of light exits through the top surface, as described in U.S. Pat. No. 3,676,668 to Collins, Kerber, and Neville. The encapsulant may be shaped to also function as a lens. The aforesaid patent also discloses a way of increasing the amount of emitted light by mounting the bottom of the diode on a mechanical support and electrical contact member in a manner so that a major portion of the bottom surface is bounded by air or other low optical refractive index material so as to reduce the critical angle and hence increase internal light reflection at the bottom surface, thereby increasing the amount of light emitted upwardly through the top surface of the diode.

SUMMARY OF THE INVENTION

Objects of the invention are to provide an improved method for making contacts to semiconductor light conversion elements, and to increase the efficiency and light output of such elements.

The invention comprises, briefly and in a preferred embodiment, the steps of providing a layer of metal such as gold-germanium eutectic on a surface of a semiconductor light conversion element such as n-doped gallium phosphide, temporarily heating to cause the metal of the layer to separate into distributed individual lumps of metal sintered onto the semiconductor surface, and making electrical contact to at least some of the distributed lumps of metal. The aforesaid heating may be at a temperature of about 550°C for a time of about two to five minutes, in a reducing atmosphere.

DESCRIPTION OF THE PREFERRED EMBODIMENT

Figure 1:
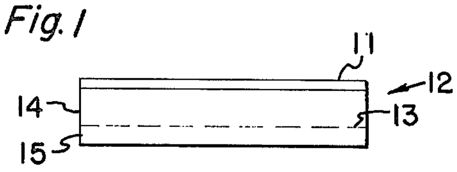
FIG. 1 is a side view of a p-n junction semiconductor light conversion device having a thin metal layer on the top surface thereof.

In FIG. 1, a layer 11 of metal has been deposited over the top surface of a semiconductor light conversion wafer 12 having a p-n junction 13 therein substantially parallel to the top and bottom surfaces of the wafer, and functioning as a light-emitting diode or as a light-sensitive diode. The light conversion wafer 12 may be made from gallium arsenide, gallium phosphide, gallium arsenide phosphide, silicon carbide, or other suitable semiconductor materials suitably doped to provide the p-n junction 13. Generally, but not necessarily, the thicker portion 14 of the wafer above the junction 13 will be doped to provide n-type material, and the thinner portion 15 below the junction will be doped to provide p-type material. The metal layer 11 may be applied to the top surface of the wafer 12 by any known means, such as by thermal evaporation, sputtering, chemical vapor deposition, or electroplating. A metal composition for the layer 11, especially suitable for use with an n-doped layer 12 of which the basic material is gallium phosphide, is a gold-12 weight percent germanium eutectic.

Figure 2:
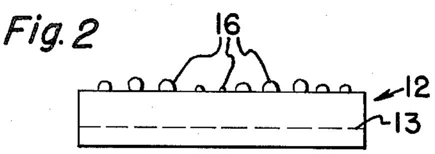
FIG. 2 is a side view of the light conversion element, during and after heating to cause the metal of the layer to separate into distributed individual lumps of metal sintered onto the semiconductor surface.

The metal layer 11 is then heated temporarily to cause the metal of the layer 11 to separate into distributed individual lumps 16 on the top surface of the wafer 12, as shown in FIG. 2, these lumps 16 of metal being sintered into the n-doped surface of the wafer 12, and the remaining area of the top surface of wafer 12 being free of any metal. The aforesaid heating step may be accomplished in a furnace or by radiant heating. A suitable temperature for causing the aforesaid gold-germanium eutectic to form the individual lumps of metal sintered onto the top surface of the semiconductor wafer, is about 550°C to 600°C, for a time of about two to five minutes, in a reducing atmosphere; however, temperatures as low as 430°C have given satisfactory results.

Figure 3:
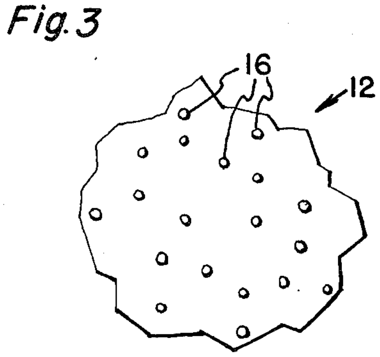
FIG. 3 is a top view of a portion of FIG. 2.

FIG. 3 is a top view of a portion of FIG. 2 illustrating the random distribution and size of the individual lumps of metal sintered onto the semiconductor surface. The size and shapes of the individual lumps 16 vary somewhat, some of them being generally spherical as indicated by numeral 16*a* in FIG. 4, and having a relatively small area sintered onto the top surface of the wafer 12 as indicated at 16*a'*. At the other extreme of shapes, numeral 16*b* in FIG. 4 indicates a dome-shaped lump of metal of which the area 16*b'* that is sintered onto the top surface of the wafer 12 has an area at least as large as that of the lump 16*b*.

The wafer is then diced into a plurality of individual light conversion elements 12' (shown in FIGS. 5 and 6) each having a plurality of metal lumps distributed on the surface. Alternatively, the method can be used to provide metal lumps on individual elements 12'.

Figure 5:
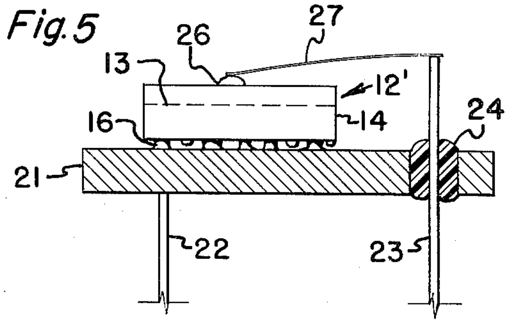
FIG. 5 is a side view of the light conversion element bonded onto a support and contact header, the tips of the distributed metal lumps being in contact with and alloyed onto the surface of the header.

An electrical contact is made to some or all of the individual lumps 16 of metal. One way of accomplishing this is shown in FIG. 5, in which the element 12' is positioned so that at least some of the lumps 16 are in contact with the surface of a support and electrical contact member 21, which may comprise a gold-plated Kovar header. The arrangement is heated to a temperature of about 450°C for just enough time for the outer tips of some of the lumps 16 to melt and alloy with the gold plating on the header to provide good mechanical and electrical contact with the gold plating of the header 21 as is more fully described in the above-referenced patent application Ser. No. 427,934. This leaves a major portion of the area of the now bottom surface of the element 12' bounded by air, which has the effect of greatly increasing internal light reflectivity at this now bottom surface, as described more fully in the above-referenced patent, thereby increasing the amount of light desirably emitted through the now top surface of the element 12'.

The construction is completed by providing a lead-in conductor 22 attached to the header 21, and a second lead-in conductor 23 extending through an opening in the header 21 and held in place and electrically insulated from the header by a glass or ceramic bead 24. A small dot electrical contact 26 is provided on the now top surface of the element 12', and is connected by means of a fine wire 27 to the upper end of the lead-in wire 23, as described in the above referenced patent. The structure may be encapsulated as described in the above-referenced patent, or may be provided with a cylindrical cap and lens as described in U.S. Pat. No. 3,458,779, issued July 29, 1969 to Drs. Blank and Potter.

Figure 6:
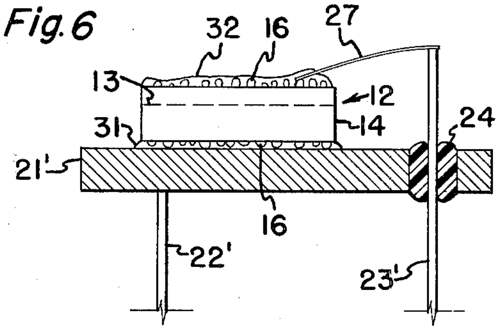
FIG. 6 is a side view of a light conversion element in which both the top and bottom surfaces have been provided with distributed lumps of metal, the lumps of metal at the bottom surface thereof being bonded to the header by means of epoxy cement, and the metal lumps at the top surface thereof being contacted by a transparent conducting coating.

FIG. 6 shows an arrangement in which the semiconductor light conversion element 12' has been provided with distributed individual lumps of metal on both top and bottom surfaces by the method described above with reference to FIGS. 1 through 4. The metal lumps may be formed on one surface and then on the other surface, or on both surfaces simultaneously. Due to the high surface tension of the molten metal layer, the wafer 12 need not be oriented in any particular position during the process; it can be horizontal, vertical, or at any angle. One surface of the element 12' is positioned against or adjacent to the header 21' and bonded thereto by means of an electrically conductive epoxy cement 31, which preferably is clear so that light escaping through the bonded surface can be reflected back into the element 12 from a bright reflective surface of the header 21'. The conductive cement 31 makes electrical contact between the header 21' and all of the metal lumps 16 of the bonded surface of the element 12'. Alternatively the bonding may be accomplished as in FIG. 5. Transparent conducting metal oxide contact material 32 (such as tin oxide) is applied (such as by sputtering techniques) over the light-exiting surface of the element 12', and makes electrical contact with all of the metal lumps 16 on this surface. This transparent coating is appplied before the wafer is diced into individual elements. The end portion of the fine contact wire 27 is bonded to this transparent conductive coating 32 such as by being embedded in it. The transparent conductive contact coating 32 is more fully described in the above-referenced patent application Ser. No. 427,934.

Preferably the wafer 12 is not heated to as high a temperature as is the metal layer 11 during the formation of the metal lumps as shown in FIG. 2, so as to help insure proper formation of the individual metal lumps 16. This can be aided by applying radiant heating to the metal layer. When the gold-germanium eutectic is used, its melting temperature is lower than the temperature at which the fusing takes place. Thus, since it melts before it fuses, the formation of distributed lumps is assured. For a material other than gold-germanium, which melts at a high temperature, a neutral element can be added to lower the melting temperature to below the fusion temperature. It is found that the temperature at which the individual lumps 16 are formed and sintered into the surface of the wafer 12 is not very critical as to the sizes of the metal lumps 16, and hence the temperature can be chosen primarily for obtaining suitable low resistance electrical contact between the metal lumps 16 and the semiconductor wafer 12. Also, the thickness of the metal layer 11 is not particularly critical; thicknesses from 500 A. to 5000 A. have been found suitable. The taller of the metal lumps 16 may be about 100,000 A. (0.01 mm). The size of the lumps is exaggerated in the drawing.

The top surface finish of the wafer 12, to which the metal layer 11 is applied, is found to have an effect on the size and distribution of the metal lumps 16. The smoother the surface, the larger will be the metal lumps 16, and they will be relatively farther apart from one another. Conversely, on a relatively rougher surface, the metal lumps 16 will be smaller and relatively closer together. It is found that a smoother surface, which causes formation of relatively larger metal lumps 16 spaced relatively farther apart, tends to desirably provide a relatively smaller overall total area of metal lumps as compared with the exposed metal-free surface area of the wafer (for example, 5% total area of metal lumps and 95% metal-free area), which is desirable for permitting a maximum amount of light to exit through the surface when used as the light-exiting surface, and also for maximizing the internal light reflection at the surface when the surface is the non-light-existing surface of the wafer.

Figure 4:
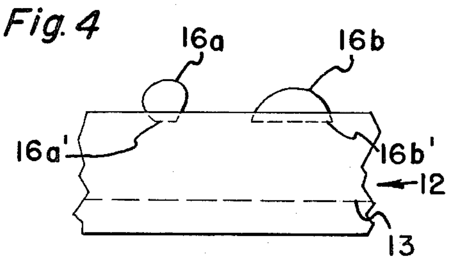
FIG. 4 is a side view of a portion of the light conversion element, showing two opposite extremes of configuration of the distributed lumps of metal.

Referring to FIG. 4, a metal lump shaped as indicated at 16*a* is preferable at the light reflective surface of the diode, since the area 16*a'* of the lump sintered onto the wafer surface is relatively small, whereas the dome-shaped type of lump indicated by numeral 16*b* has a sintered contact area 16*b* which is at least as large in area as that of the lump 16*b*. At the light-exiting surface of the element, however, it is the external diameter or area of the lumps 16*a* and 16*b* that are the most relevant to obstruction and/or scattering of light emitting through the surface of the element 12. Generally the shape 16*a* is preferred since its contact area with the wafer is smaller and the emitted light will merely be scattered, rather than absorbed and lost.

It is believed that numerous combinations of metal or metal alloys may be used for the initial metal layer 11, in combination with numerous different materials for the semiconductor 12. An advantage of the method of the invention, in addition to those described above, is that the electrical connection made to the surface or surfaces of the diode 12', are distributed electrically over the entire surfaces, thus providing for a more uniform current flow through the thickness of the element 12' throughout the entire volume thereof, whereas a conventional small dot contact 26 as shown in FIG. 5 causes a higher density of current in the vicinity of the dot contact, and relatively smaller current density through the element 12' at places laterally remote from the contact 26. Also, the method of the invention is low in cost, and reliable, and eliminates the need for a masking process for providing the contacts, and eliminates the need for different masks having different patterns for applying to wafers for making different sizes of elements 12'. While the invention has been described primarily with reference to light-emitting diodes, the same method and principles can be applied to light-sensitive diodes.

It should be mentioned that Messrs. Braslau, Gunn, and Staples of IBM Watson Center have reported in "Solid-State Electronics", Pergamon Press (Great Britain), 1967, Vol. 10, pages 381–383, an undesirable formation of "droplets" or "islands" of an alloyed contact on semiconductor elements, and describe how to prevent the formation of such droplets or islands of the metal layer material. Also U.S. Pat. No. 3,702,290 issued Nov. 7, 1972 to Yu, Gopen, and Waits describes how to prevent "balling" and formation of islands on semiconductors.

While preferred embodiments and modifications of the invention have been shown and described, other embodiments and modifications will become apparent to persons skilled in the art and will be within the scope of the invention as defined in the following claims, in which the method of making distributed lump contacts to an element covers both alternatives of applying the lump contacts to an individual element or of applying the lump contacts to a wafer which is then diced into elements.

What I claim as new and desire to secure by Letters Patent of the United States is:

1. A method of making electrical contact to a semiconductor light conversion element, comprising the steps of providing a layer of metal on a surface of said element, temporarily heating said metal layer to cause it to separate into distributed individual lumps of metal sintered onto said surface of the element, and making an electrical contact to at least some of said distributed lumps of metal over substantially the entire said surface.

2. A method as claimed in claim 1 in which said step of making electrical contact comprises the steps of positioning said element so that the outer tips of at least some of said metal lumps are against the surface of an electrically conductive contact member, and temporarily heating to cause said outer tips to melt into contact with said surface of the contact member.

3. A method as claimed in claim 1 in which said step of making electrical contact comprises the step of bonding said metal lumps to the adjacent surface of an electrically conductive contact member by means of an electrically conductive cement.

4. A method as claimed in claim 1 in which said step of making electrical contact comprises the step of applying a transparent electrically conductive metal oxide material over said surface of the element and in electrical contact with at least some of said distributed lumps of metal.

5. A method as claimed in claim 1 in which said element comprises gallium phosphide, said metal comprises a gold-germanium eutectic, and said temporary heating is at a temperature of about 450°C to 600°C.

6. A method as claimed in claim 1 in which said element is a p-n junction light-emitting diode.

7. A method as claimed in claim 1 in which said element is a p-n junction light-sensitive diode.

8. A method as claimed in claim 1 in which said element comprises two substantially parallel surfaces and a p-n junction between and substantially parallel to said surfaces, said distributed lumps of metal being formed on a first one of said parallel surfaces, and including the steps of providing a second layer of metal on the second one of said parallel surfaces, temporarily heating said second metal layer to cause it to separate into distributed individual lumps of metal sintered onto said second surface of the element, and making an electrical contact to at least some of said last-named distributed lumps of metal.

9. A method as claimed in claim 8 including the steps of positioning said element with said first parallel surface thereof adjacent to the surface of an electrically conductive contact member, bonding at least some of the metal lumps on said first surface of the element to said surface of the contact member, and applying a transparent electrically conductive metal oxide material over said second surface of the element and in electrical contact with at least some of the distributed lumps of metal on said second surface of the element.

10. A method as claimed in claim 9 including the step of attaching a portion of a connector wire to said metal oxide material.

* * * * *